(12) United States Patent
Shih-Tsung

(10) Patent No.: US 6,961,243 B2
(45) Date of Patent: Nov. 1, 2005

(54) CPU HEATSINK FASTENER

(76) Inventor: Chen Shih-Tsung, 3F No. 107 Kang-Le St., Taipei (TW)

( * ) Notice: Subject to any disclaimer, the term of this patent is extended or adjusted under 35 U.S.C. 154(b) by 45 days.

(21) Appl. No.: 10/607,841

(22) Filed: Jun. 27, 2003

(65) Prior Publication Data

US 2004/0114329 A1 Jun. 17, 2004

(30) Foreign Application Priority Data

Jun. 28, 2002 (TW) ...................................... 91209839 U

(51) Int. Cl.[7] .............................................. H05K 7/20
(52) U.S. Cl. ....................... 361/700; 361/699; 361/704; 257/714; 257/715; 257/718; 257/727; 174/15.2; 165/80.4; 165/104.26; 165/185
(58) Field of Search ................................. 361/687, 695, 361/703, 704, 709–712, 717–719; 257/718, 722, 727; 165/80.3; 24/457–458; 174/15.2, 16.3; 248/510

(56) References Cited

U.S. PATENT DOCUMENTS

| | | | | | |
|---|---|---|---|---|---|
| 5,495,392 | A | * | 2/1996 | Shen | 361/697 |
| 5,671,118 | A | * | 9/1997 | Blomquist | 361/704 |
| 6,643,133 | B1 | * | 11/2003 | Liu | 361/704 |
| 6,646,880 | B1 | * | 11/2003 | Liu | 361/719 |
| 6,704,976 | B1 | * | 3/2004 | Chen | 24/459 |
| 6,708,754 | B2 | * | 3/2004 | Wei | 165/46 |
| 2004/0052055 | A1 | * | 3/2004 | Liu | 361/719 |

* cited by examiner

Primary Examiner—Boris Chervinsky
(74) Attorney, Agent, or Firm—Fenwick & West LLP

(57) ABSTRACT

A retaining apparatus for securely fastening a heat sink to a CPU includes a press plate part, a hold bar part, and a retaining bar part. The retaining apparatus is installed by engaging hook legs of the hold bar and retaining bar parts with a CPU base. In this configuration, the press plate of the retaining apparatus presses against and secures the heat sink.

12 Claims, 3 Drawing Sheets

CPU HEATSINK FASTENER

CROSS REFERENCE TO RELATED APPLICATIONS

This application claims the right of priority based on Taiwan application serial no. 091209839, filed on Jun. 28, 2002, which is herein incorporated in its entirety by reference.

BACKGROUND

1. Field of the Invention

The present invention relates to retaining a CPU cooling apparatus to a CPU for efficient heat transfer.

2. Background of the Invention

The function of a computer's central processing unit (CPU) plays an important role in the effectiveness of the computer. For this reason, manufactures conduct research and development to improve the functionality of the computer to meet the needs of users. Research and development continue to produce computers with increasing capacity, faster operational speeds, and more powerful functionalities. In large part, these improvements are due to the efforts to create a more powerful CPU.

In a conventional computer assembly, heat dissipation is performed by way of attaching a heat sink on top of the CPU. The heat sink includes a plurality of cooling fins on the top and/or sides of the heat sink so that heat is guided via conduction from the CPU to the bottom of the heat sink contacting with the CPU, and then to the cooling fins. The heat is then drawn out of the computer housing by a cooling fan that passes a flow of air over the cooling fins. Regardless of specific implementations, efficient heat dissipation from the CPU is promoted by good thermal contact between the CPU and the heat sink, which depends on how well the heat sink is secured to the CPU.

Existing methods for attaching a heat sink to a CPU have some drawbacks. One deficiency is that the heat sink and the CPU may not maintain good thermal contact to each other during operation of the computer. Keeping good thermal contact between the heat sink and the CPU is important for effective heat conduction; otherwise, the heat conduction from the CPU to the heat sink becomes less effective. Additionally, attaching a heat sink to the CPU may require special tools or joining components. Further, for heat sinks that have a lateral side attached to an auxiliary cooling device (e.g., by one or more heat pipes 51), the center of gravity of the heat sink and cooling device assembly is not aligned with the CPU. This may cause the heat sink to lift off from horizontal contact with the CPU unless the heat sink is secured to the CPU tightly.

SUMMARY OF THE INVENTION

An embodiment of the present invention provides a retaining apparatus for securely fastening a heat sink to a CPU for dissipating heat therefrom. In one embodiment a retaining apparatus comprises a press plate part, a hold bar part, and a retaining bar part. The press plate part includes spring members and a central part, the central part being lower than the spring members. The hold bar part is joined to the press plate part and has one or more hook legs extending downward and being releasably engageable with a CPU base. The retaining bar part is disposed at a side of the press plate part opposite to the hold bar part. Movably coupled to the retaining bar part are one or more movable hook legs. The movable hook legs extend downward and are also releasably engageable with a CPU base. The retaining apparatus secures a heat sink to be thermally coupled with a CPU and placed over a CPU base. The retaining apparatus is installed by engaging the hook legs of the hold bar part and the movable hook legs of the retaining bar part with a CPU base. In this configuration, the press plate of the retaining apparatus presses against and secures the heat sink.

In another embodiment, the invention provides a cooling assembly for a CPU. The cooling assembly includes a heat sink configured to fit over and thermally couple with a CPU located within a CPU base. The heat sink is further coupled to an auxiliary radiator by one or more heat pipes. A retaining apparatus is used to secure the heat sink, the retaining device configured to releasably engage with the CPU base. The retaining device having a resilient press plate so that, when engaged with the CPU base, the press plate deflects from a rest state and applies a securing force against the heat sink to keep the heat sink in place and in good thermal coupling with the CPU.

The novel features of the invention are set forth with particularity in the appended claims. The invention will be best understood from the following description when read in conjunction with the accompanying drawings.

DETAILED DESCRIPTION OF THE PREFERRED EMBODIMENTS

Figure 1:
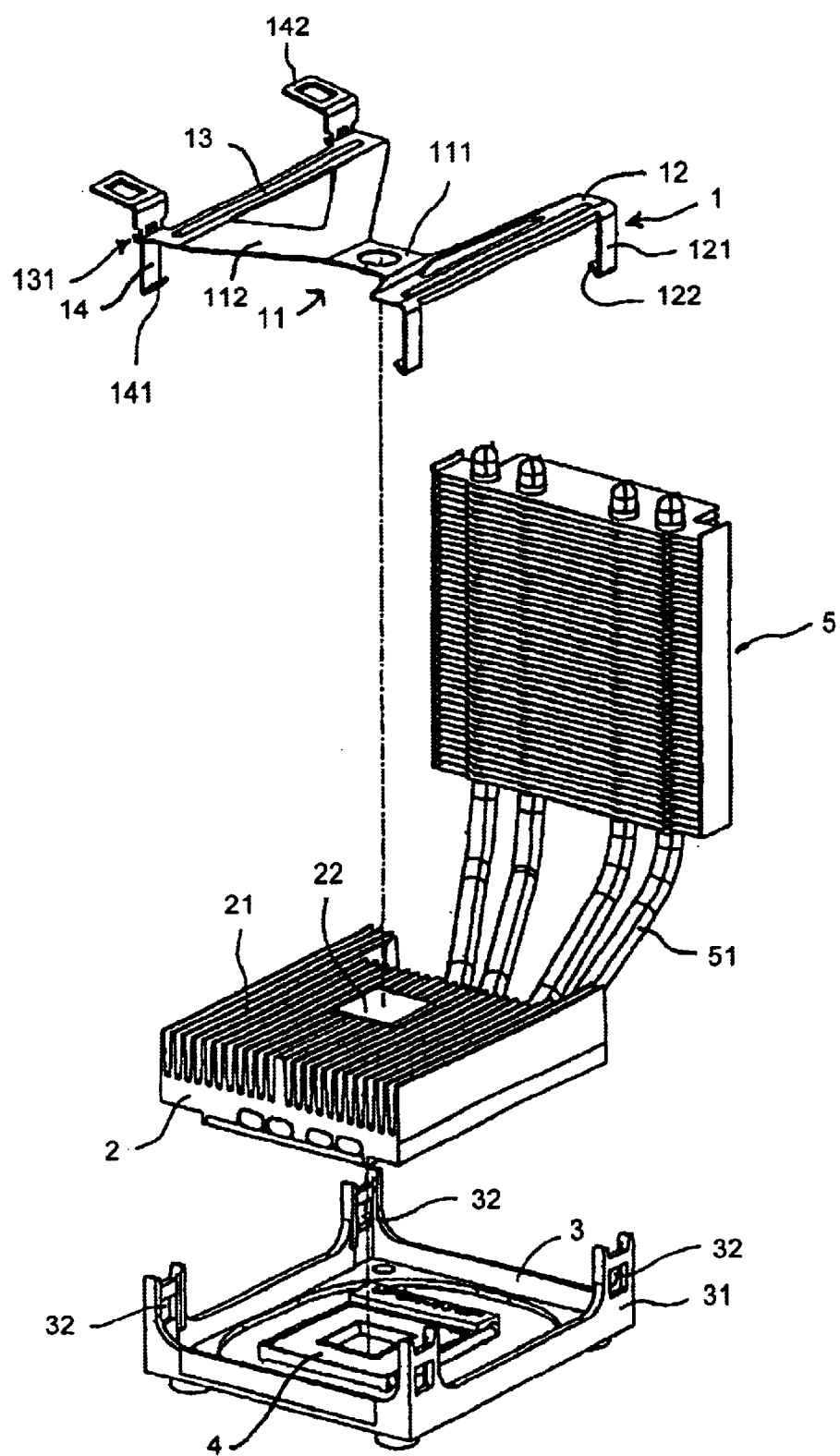
FIG. 1 is a disassembled view of a CPU cooling assembly in accordance with an embodiment of the invention.

FIG. 1 shows a disassembled view of a CPU cooling apparatus in accordance with an embodiment of the invention. The cooling assembly comprises a retaining apparatus 1 for securing a heat sink 2 to a CPU base 3, thereby causing the heat sink to couple thermally with a CPU (not shown) that is installed in a CPU socket 4 located within the CPU base 3.

In operation, a CPU is installed in a CPU socket 4 and is thus located within the CPU base 3. The CPU base 3 is generally square or rectangular shaped, and includes four corners. A post 31 extends upward from each of the four corners of the CPU base 3. Each post includes a square post hole 32 for engaging with the retaining apparatus 1. CPU base 3 typically has a size in accordance with a standard specification, such as the P4 type; however, it is understood that the invention can be practiced with various types of CPU bases.

The space confined within the four posts 31 of the CPU base 3 is received by the heat sink 2, which typically has a square shape corresponding to the CPU base 3. An upper section of the heat sink 2 is formed with a heat discharge assembly 21, which includes a plurality of upright and parallel heat discharge plates. Additionally, a top plate 22 may be disposed at the upper central area of the heat discharge assembly 21 to form a greater conduction area.

Figure 2:
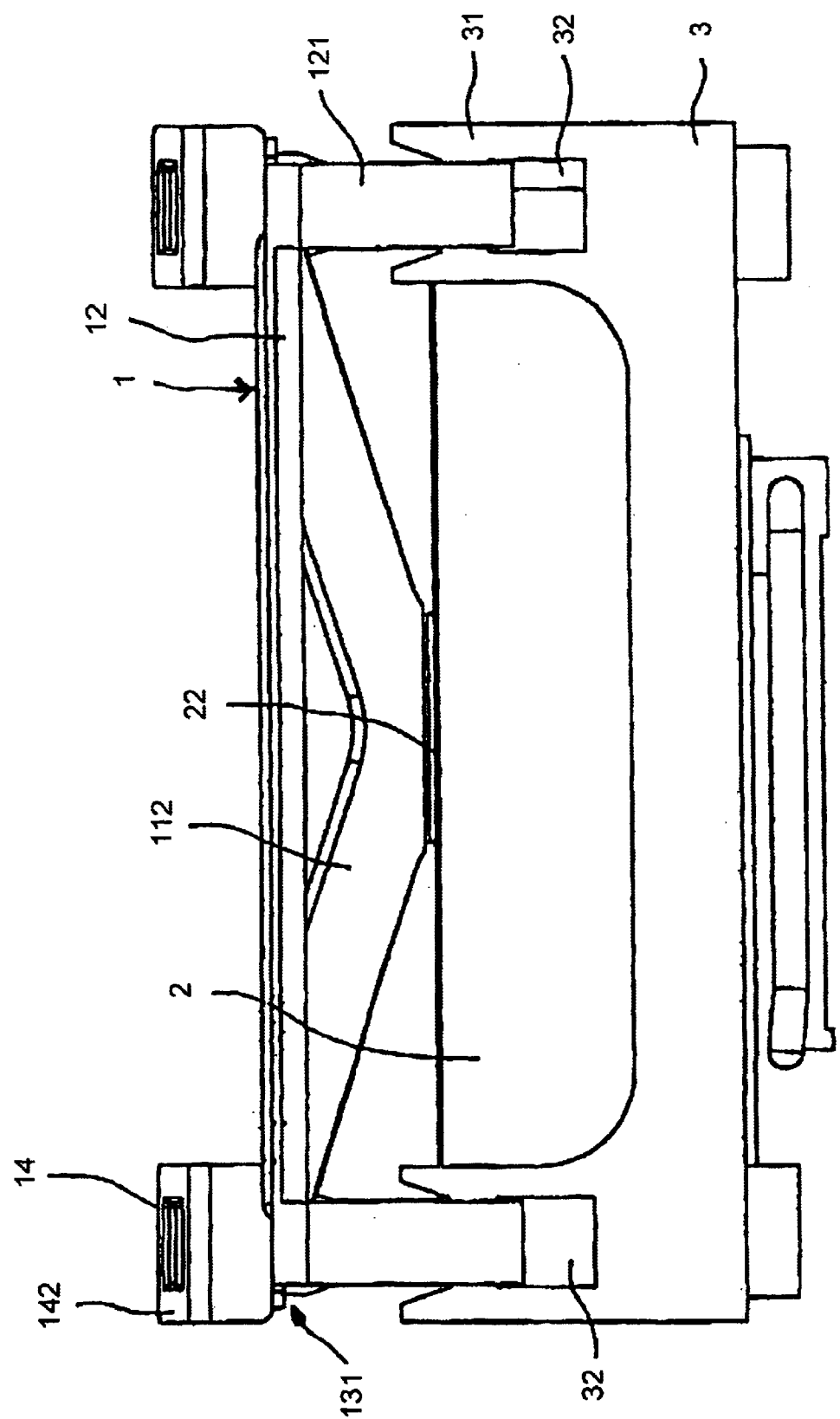
FIG. 2 is a front view of a retaining apparatus in a state of engagement in accordance with one embodiment of the invention.

In one embodiment of the invention, the heat sink 2 is further coupled to an auxiliary radiator device 5, for example, by a plurality of heat pipes 51 emerging from the heat sink 2 at a lateral side thereof. In one configuration, the auxiliary radiator device 5 is offset from the center of the heat sink 2 as shown in FIG. 2. Because of this configuration, the weight of the auxiliary radiator device 5 will apply a torque on the heat sink 2 when installed, thus causing a lifting torque on the heat sink 2 away from the CPU. Therefore, the addition of the auxiliary radiator device 5 increases the need for a mechanism to secure the heat sink 2 tightly to the top side of the CPU.

In one embodiment, the retaining apparatus 1 is made with a stamped plate, and the size thereof is made to correspond to and engage with the CPU base 3. The retaining apparatus 1 comprises a press plate part 11 at the middle thereof, a hold bar part 12 at a lateral side thereof, and a retaining bar part 13 at an opposite lateral side thereof. The press plate part 11 is slanted downward to the middle of the retaining apparatus 1 so that it can engage resiliently with a heat sink 2 and thereby apply a securing force thereto.

In one embodiment, the press plate part 11 of the retaining apparatus 1 includes a middle plate 111 for engaging the heat sink 2. The middle plate 111 is attached to the hold bar part 12 and retaining bar part 13 by spring members 112. The spring members 112 deflect when the retaining apparatus 1 is installed on a heat sink 2, and the resulting force caused by their deflection is directed against the heat sink 2 and helps to secure the heat sink 2 in place. To produce a uniform force on the heat sink 2, the spring members 112 may be radially symmetrical with respect to the middle plate 111. In one embodiment, for example, the spring members generally form the shape of an X, the middle plate 111 located at the central intersection thereof. Additionally, other configurations of the press plate part 11 are possible. For example, the middle plate 111 may be solid or formed with a hole. Moreover, a pure plate, two parallel strips, or the like can be used instead of the middle plate 111.

The hold bar part 12 is joined to the press plate part 11, and the hold bar part 12 and the press plate part 11 may be formed integrally by way of stamping. The hold bar part 12 of the retaining apparatus 1 includes hook legs 121 that extend downward from the ends of the hold bar part 12. The hook legs 121 include an inward inverted leg hook 122 at the free end of the hook leg 121 to engage with a post hole 32 of the CPU base 3.

The retaining bar part 13 is also joined to the press plate part 11, and the retaining bar part 13 may be formed integrally with the press plate part 11 by way of stamping. The ends of the retaining bar part 13 may provide a pivot mechanism 131 to movably couple the retaining bar part 13 to movable hook legs 14. The pivot mechanism 131 can be formed by a projection from the retaining bar part 13 through an opening of the movable hook legs 14, or by any structure that allows the hook legs 14 to rotate a small amount about the pivot mechanism 131. In another embodiment, the movable hook legs 14 are formed integrally with the retaining bar part 13 and move with respect to the retaining bar part 13 due to the resiliency of the material. Like the hook legs 121, the movable hook legs 14 include at the lower end thereof an inward bend hook end 141 for engaging with the post holes 32 of the CPU base 3. The movable hook legs 14 further include a press plate 142 extending upward at a top end. These press plates 142 facilitate the rotation of the movable hook legs 14 with respect to the retaining bar part 13 for the purpose of engaging and disengaging the retaining apparatus with the CPU base 3. As shown in FIG. 1, the movable hook legs 14 are independently disposed to each other and, alternatively, the movable hook legs 14 can be joined with a connection plate or formed of a single, integral part.

In one embodiment, the retaining apparatus 1 is made of heat conductive material, such as a metal, to enhance further heat dissipation from the CPU. The retaining apparatus 1 can be constructed from a sheet of metal by way of stamping. Further, the retaining apparatus 1 may be formed with reinforced ribs to increase the strength of the retaining apparatus 1.

Figure 3:
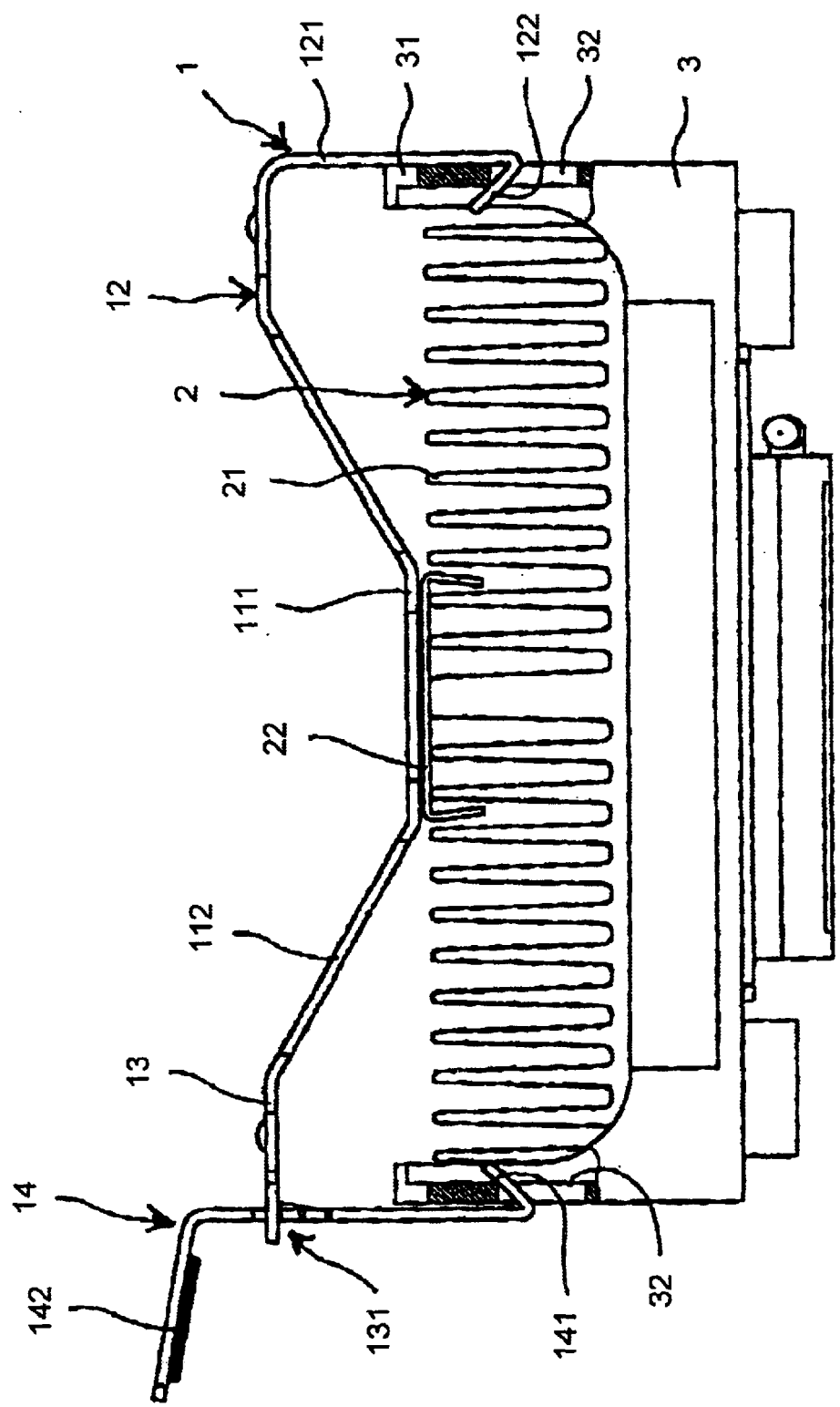
FIG. 3 is a cross-sectional view of the retaining apparatus in a state of engagement in accordance with one embodiment of the invention.

When used to secure the heat sink 2, the retaining apparatus 1 is pressed against the upper side of the heat sink 2 to keep the heat sink 2 in place. To assemble the cooling assembly shown in FIG. 1, a CPU is installed in the CPU socket 4, and the heat sink 2 is placed over the CPU. The hook legs 121 of the retaining apparatus 1 are inserted into the post holes 32 in the posts 31 at one of the lateral sides of the CPU base 3. The retaining apparatus 1 is then pressed against the heat sink 2, thereby deflecting the press plate part 11 of the retaining apparatus 1. With the retaining apparatus 1 pressed against the heat sink 2, the hook ends 141 of the movable hook legs 14 are inserted into the post holes 32 in the posts 31 at the opposite lateral side of the CPU base 3. This is accomplished by pressing against the press plates 142, causing them to turn outward and the hook ends 141 to turn inward into the post holes 32. As a result, the retaining apparatus 1 is fastened to the CPU base 3 and is pressed against the heat sink 2. In its deflected state, the press plate part 11 applies a securing force against the heat sink 2 to keep it in place and in good thermal coupling with the CPU. FIGS. 2 and 3 show front and cross-sectional views of the retaining apparatus in a state of engagement.

When the retaining apparatus 1 is to be disengaged, the retaining apparatus 1 is pressed against the heat sink 2 to loosen the movable hook legs 14, and the press plates 142 are pulled upward to remove the hook ends 141 from the post holes 32. With the movable hook legs 14 disengaged from the CPU base 3, the remaining hook legs 12 are removed from their respective post holes 32, thereby completely disengaging the retaining device from the CPU base 3.

Beneficially, the operation of engaging and disengaging the retaining apparatus 1 in accordance with one embodiment of the invention does not require the aid of special tools or other parts, and the operation can be performed quickly and easily by any user.

It is appreciated that the retaining apparatus 1 of an embodiment of the present invention can secure the heat sink 2 by pressing in the middle thereof—in possible addition to engagement at four corners thereof—so as to attain tight contact between the CPU base 3 and the retaining apparatus 1. This in turn maintains good thermal coupling between the heat sink 2 and the CPU. Furthermore, the tightness of the engagement between the retaining apparatus 1 and the heat sink 2 can be adjusted by adjusting the height of the top plate 22. The tightness can also be adjusted by adjusting the geometry and the stiffness of the press plate part 11. Creating a sufficient force on the heat sink 2 in a middle region thereof reduces the possibility of any clearance between the heat sink 2 and the CPU. Such a clearance could result, for example, from an insufficiently tight engagement or from a deviated center of gravity due to an auxiliary device 5 joined laterally to the heat sink 2.

The foregoing description of the embodiments of the invention has been presented for the purposes of illustration and description. It is not intended to be exhaustive or to limit the invention to the precise forms disclosed. For example, although the retaining apparatus described employs four hook legs to engage with the CPU base, other embodiments of the retaining apparatus may employ fewer or additional hooks legs. Additionally, the retaining apparatus may employ a different attaching mechanism depending on the design of the CPU base. Persons skilled in the relevant art can appreciate that many modifications and variations are possible in light of the above teaching. It is therefore intended that the scope of the invention be limited not by this detailed description, but rather by the claims appended hereto.

I claim:

1. A retaining apparatus for securing a heat sink in thermal coupling with a CPU, the retaining apparatus comprising:

a press plate part having spring members and a central part, the central part being lower than the spring members;

a hold bar part joined to the press plate part, the hold bar part having one or more hook legs extending downward and being releasably engageable with a CPU base;

a retaining bar part disposed at a side of the press plate part opposite to the hold bar part; and one or more movable hook legs movably coupled to the retaining bar part, the movable hook legs extending downward and being releasably engageable with a CPU base;

wherein when a heat sink is placed over a CPU base the retaining apparatus is installed by engaging the hook legs of the hold bar part and the movable hook legs of the retaining bar part with a CPU base, the press plate of the retaining apparatus presses against a central area of the heat sink and thereby secures the heat sink.

2. The retaining apparatus of claim 1, wherein the movable hook legs are joined together by a connecting plate.

3. The retaining apparatus of claim 1, wherein the retaining apparatus is composed of a heat conductive metal.

4. The retaining apparatus of claim 1, wherein the press plate part, the hold bar part, and the retaining bar part are formed integrally by way of stamping.

5. The retaining apparatus of claim 1, wherein the movable hook legs include outward turn plates so that pressing or pulling on the outward turn plates tends to rotate the movable hook legs with respect to the retaining bar part.

6. The retaining apparatus of claim 1, wherein the spring members of the press plate part are radially symmetrical.

7. The retaining apparatus of claim 6, wherein the spring members of the press plate generally form an X shape, the central part located at the intersection thereof.

8. A the cooling assembly comprising: a heat sink configured to fit over and thermally coupled with a CPU, located within a CPU base; an auxiliary radiator thermally coupled to the heat sink by one or more heat pipes;

attaching means for releasably engaging the retaining apparatus to the CPU base;

resilient means for pressing against a central portion of the heat sink when the retaining apparatus is engaged with the CPU base, thereby securing the heat sink to the CPU for receiving heat therefrom; and detaching means for disengaging the retaining apparatus from the CPU base.

9. A cooling assembly for a CPU, the cooling assembly comprising:

a heat sink configured to fit over and thermally couple with a CPU, located within a CPU base;

an auxiliary radiator thermally coupled to the heat sink by one or more heat pipes; and a retaining apparatus for securing the heat sink, the retaining device configured to releasably engage with the CPU base, the retaining device having a resilient press plate so that, when engaged with the CPU base, the press plate deflects from a rest state and applies a securing force against the heat sink to keep the heat sink in place and in good thermal coupling with the CPU.

10. The cooling assembly of claim 9, the retaining apparatus includes four hook legs at four corners thereof, the hook legs configured to engage with hole in each of four posts of the CPU base.

11. The cooling assembly of claim 9, wherein the heat sink includes a plurality of heat discharge fins and a top plate, the top plate disposed on top of the heat sink and configured to contact the press plate of the retaining apparatus when installed.

12. The cooling assembly of claim 9, wherein the auxiliary radiator is configured to couple to a fan for receiving a flow of air directed through the auxiliary radiator and outside of a computer housing enclosing the cooling assembly.

* * * * *

UNITED STATES PATENT AND TRADEMARK OFFICE
CERTIFICATE OF CORRECTION

PATENT NO. : 6,961,243 B2
DATED : November 1, 2005
INVENTOR(S) : Chen Shih-Tsung It is certified that error appears in the above-identified patent and that said Letters Patent is hereby corrected as shown below:

Column 6,
Line 4, remove "the" after "A".

Signed and Sealed this

Seventh Day of February, 2006

JON W. DUDAS
*Director of the United States Patent and Trademark Office*